United States Patent [19]

Esseluhn

[11] 4,085,038

[45] Apr. 18, 1978

[54] METHODS OF AND APPARATUS FOR SORTING PARTS OF A SEPARATED ARTICLE

[75] Inventor: Werner F. Esseluhn, Wyomissing, Pa.

[73] Assignee: Western Electric Co., Inc., New York, N.Y.

[21] Appl. No.: 750,943

[22] Filed: Dec. 15, 1976

[51] Int. Cl.² .............................................. B07C 7/00
[52] U.S. Cl. ......................................... 209/71; 209/122
[58] Field of Search ..................... 209/71, 72, 74, 122, 209/123, 126; 156/584

[56] References Cited

U.S. PATENT DOCUMENTS

| | | | |
|---|---|---|---|
| 2,378,091 | 6/1945 | McCormick | 49/77 |
| 2,978,804 | 4/1961 | Soper et al. | 29/413 |
| 3,040,489 | 6/1962 | Da Costa | 53/21 |
| 3,421,962 | 1/1969 | Topas | 156/345 |
| 3,497,948 | 3/1970 | Wiesler et al. | 29/583 |
| 3,537,169 | 11/1970 | Eigeman et al. | 29/413 |
| 3,537,603 | 11/1970 | Willis | 214/152 |
| 3,562,058 | 2/1971 | Boyd | 156/300 |
| 3,687,345 | 8/1972 | Carlson | 225/1 |
| 3,730,410 | 5/1973 | Altshuler | 225/96.5 |
| 3,841,930 | 10/1974 | Hetrich | 156/16 |

Primary Examiner—Allen N. Knowles
Attorney, Agent, or Firm—G. E. Montone; J. B. Hoofnagle

[57] ABSTRACT

A wafer is mounted upon a substrate and separated into individual chips which are retained on the substrate. The separated wafer and substrate are then placed on a demounting device with a passageway such that the chips on a first portion of the wafer lie over the passageway while chips on a second portion of the wafer do not. When the separated wafer is subsequently subjected to a demounting force, the chips will demount from the substrate with the chips on the first portion falling into a catch bin located in the passageway while chips on the second portion are discarded. Additional demounting devices can be provided within the passageway, if further sorting of the chips on the first portion of the separated wafer is desired.

24 Claims, 5 Drawing Figures

DEMOUNTING DEVICE CONTACT AREA

METHODS OF AND APPARATUS FOR SORTING PARTS OF A SEPARATED ARTICLE

BACKGROUND OF THE INVENTION

1. Field of the Invention

This invention relates generally to methods of and apparatus for sorting parts of an article, and more particularly, to methods of and apparatus for separating wafers into individual chips while providing for sorting of the chips.

2. Description of the Prior Art

In the area of wafer processing, particularly semiconductor wafer processing, a wide variety of methods are currently in use for separating wafers into individual chips. Broadly, two general methods are used, the first being to cut completely through the wafer with wafering saws or lasers, and the second being to scribe the wafer and subsequently break it into chips using a vacuum breaker or roller.

One problem which has been found to exist in separating a wafer into individual chips is sorting chips which are defective from those which are not. The periphery of the wafer is a special problem area, since a large percentage of chips in this region tend to become damaged during the various processing stages prior to cutting.

One prior art approach to this problem of peripheral damage, as typified by U.S. Pat. No. 3,040,489 which issued to H. DaCosta, is to scribe completely around the wafer a given distance from the periphery and then break off the peripheral region outside of the scribed line. Although this technique is straightforward and easy to implement, it requires the time and concentration of an operator to carefully scribe the line and break off the undesired portion. Also, if the procedure is not followed carefully, it can leave further defects on the chips inside of the scribe line.

Another method which has been proposed in U.S. Pat. No. 2,978,804, which issued to R. B. Soper et al., is that of applying a magnetic marking material around the peripheral region of the wafer prior to any cutting. After the wafer has been cut, the resulting chips are passed through a magnetic field to draw out those chips which are coated with the magnetic marking material. A shortcoming of this technique is the necessity of steps additional to the actual cutting and separating steps, specifically the preliminary marking and the subsequent subjection to a magnetic field.

An alternate third technique has been developed, as shown by U.S. Pat. No. 3,951,728 which issued to E. Egashira et al., in placing the wafers between plates so that only their peripheral surfaces are exposed, and immersing them in an etchant bath. Using this method the peripheral portion will be chamfered. However, this etching step, in the same manner as the magnetic marking approach, is additional to any steps used in cutting and separating.

Another problem of recent development, which is related to the aforementioned one of peripheral defects, is that of trying to find an efficient technique to sort different areas of certain wafers not because of defects but because of different characteristics found in the various portions of the wafer. An example of this is found in light-emitting-diode (LED) wafers where it has been found that the light efficiency of the wafer varies in different areas. Frequently this variation is a decrease in light efficiency as a function of distance from the wafer center. Thus, chips of very high light efficiency suitable for very high quality diodes are found near the wafer center, while chips of lower light efficiency suitable for lower tolerance applications are found in areas further out on the wafer radius. Heretofore, the time-consuming separation of these chips according to their area of light efficiency has been accomplished by hand.

SUMMARY OF THE INVENTION

It is therefore, an object of the present invention to provide new and improved methods of and apparatus for separating articles into individual parts while sorting the parts.

Another object of the present invention is to provide new and improved methods of and apparatus for the sorting of chips along the periphery of the wafer.

A further object of the present invention is to provide new and improved methods of and apparatus for sorting chips from different portions of a cut wafer mounted on a support device wherein the sorting step occurs simultaneously with the demounting step.

With these and other objects in view, the present invention contemplates a new method of and apparatus for mounting an article on a support means to facilitate separating it into parts, and then sorting the parts as they are being demounted from the support means. The separated article and support means are placed upon a demounting device which has a passageway such that the parts on a first portion of the separated article lie over the passageway while the parts on a second portion do not. A demounting force is then applied to the separated article to cause its parts to separate from the support means with the parts on the first portion of the article falling into the passageway.

BRIEF DESCRIPTION OF THE DRAWINGS

Other objects and advantages of the present invention may be more clearly understood by reference to the following detailed description and drawings wherein.

DETAILED DESCRIPTION

Mounting and Separating Operation

Figure 1:
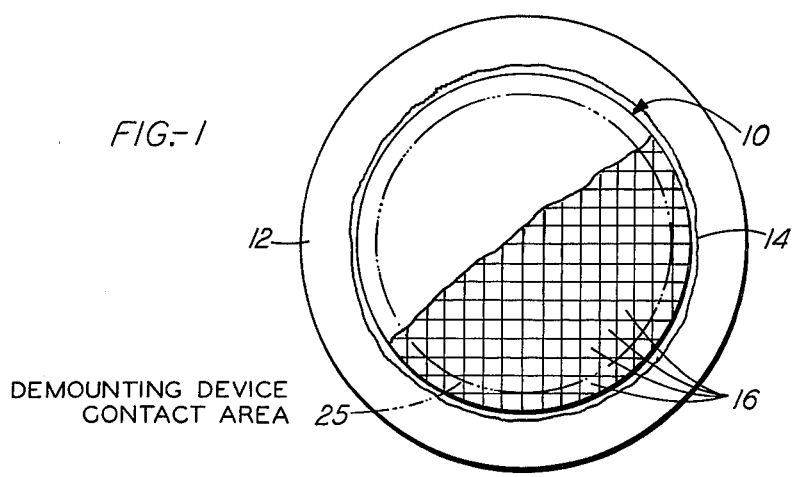
FIG. 1 is a plan view showing the arrangement of a wafer separated into chips and mounted on a substrate.

Referring now to the drawings and in particular to FIG. 1, an article such as an uncut wafer, designated generally by the numeral 10, is mounted on a carrier such as substrate 12 by means of a soluble cement 14. The unseparated wafer 10 is so mounted while it is still in its unseparated form. Once mounted, the wafer 10 can be separated into a plurality of individual chips 16 which will remain mounted on the substrate 12 by virtue of their continued contact with cement 14 even if the separations are cut completely through the wafer. For purposes of illustration, FIG. 1 shows a portion of the wafer 10 uncut while another portion is separated into chips 16. In actual practice, the entire wafer 10 will be separated into chips 16. As will herein be subsequently described, the chips 16 can be demounted from the substrate 12 by a demounting force to provide for sorting of them according to some desired classification of their characteristics.

The soluble cement 14 can be any conventional type capable of holding the wafer 10, and ultimately the chips 16, to substrate 12 during the separating operation while allowing for a dissolution of the cement to readily give complete separation of the individual chips 16 from the substrate 12 during demounting. Beeswax, Bi-wax, glycol-phtholate, Apiezon wax and Eicosane are examples of some cements which have been found satisfactory. It should be noted that it is possible to mount additional wafers 10 over the one mounted on the substrate 12 in which case the cement must be sufficiently soluble to allow separation of the individual chips 16 of different layers from one another.

Separation of the wafer 10 into chips 16 can be accomplished in any manner suitable for the chips desired. Wafering saws, diamond saws, scribers and lasers (none of which are shown) are illustrative of some present devices. The wafer 10 can be cut through completely or only partially. However, if the wafer 10 is only partially cut through, the demounting force must be such as to complete the separation between the chips 16. To some extent, the chip size and degree of edge perfection desired along with the waste tolerable for the kerf will dictate the best mode of separating. Although FIG. 1 shows the wafer 10 as circular and the chips 16 as square, any desired configurations could be used. Also, the invention is in no way limited to any particular size of either the wafer 10 or the chips 16.

The substrate 12 can also be of any dimension and material suitable to fulfill its support purposes during the separating and demounting operations. Glass and plastic are examples of materials which have proven satisfactory. Generally, but not necessarily, the substrate material should be resistant to any demounting force which is used to separate the chips 16 from the substrate 12 to prevent particles of the substrate from becoming intermixed with the chips.

Demounting Device and Operation

Figure 2:
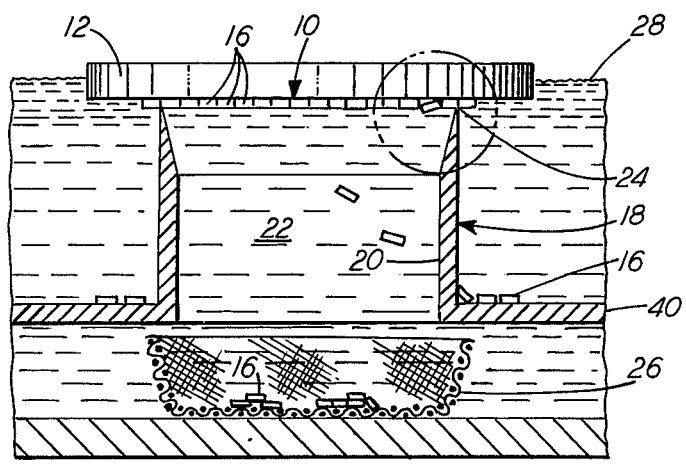
FIG. 2 is a sectional view showing the separated wafer and substrate placed on a demounting device according to the present invention.

FIG. 2 illustrates a demounting device, designated generally by the numeral 18, comprising a closed wall 20 surrounding a passageway 22. For example, the demounting device 18 may be a cylinder. The closed wall 20 also defines an upper edge 24 which surrounds the passageway 22. The cut wafer 10 and the substrate 12 are placed onto the edge 24 which will support the cut wafer 10 adjacent to the passageway 22.

Positioning of the cut wafer 10 is done in such a manner that some of the chips 16 on the wafer lie over the passageway 22 while others do not. Demounting device contact area 25 (see FIG. 1) is an example of how edge 24 can subdivide the cut wafer 10 into portions with those chips 16 which are within the contact area being over the passageway 22 while the remaining chips are outside of the contact area. A catch bin 26 is located at the bottom of the passageway 22. Demounting fluid 28, which completely immerses the cut wafer 10, the demounting device 18, and the catch bin 26, causes the cement 14 to dissolve so that the chips 16 will separate from the substrate 12 (see FIG. 3). Those chips 16 which are over passageway 22 will fall into it to be collected in the catch bin 26. The remaining chips 16 which are outside of passageway 22 will fall outside of the demounting device 18, and thus be segregated from the chips falling into the catch bin 26.

Figure 3:
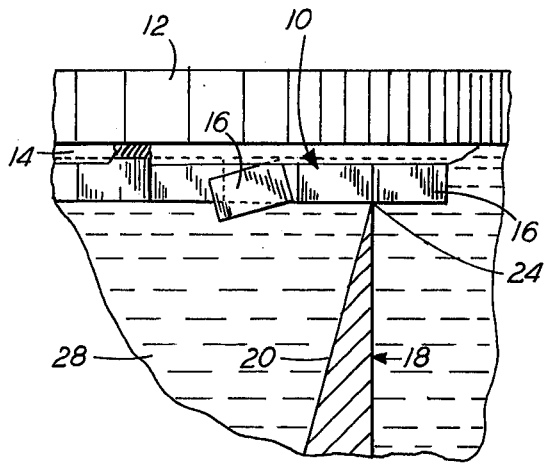
FIG. 3 is an enlarged view of the encircled portion A of FIG. 2 showing the release of a chip from the substrate.

In the particular configuration of the demounting device 18 shown in FIGS. 2 and 3, the closed wall 20 tapers internally at the top to form the edge 24. Edge 24 is preferably relatively narrow in relationship to the width of the chips 16 to permit as many chips as possible to fall either into the passageway 22 or outside of the demounting device 18 rather than being retained on the edge. Application of a vibratory motion by lifting, tapping or wiggling substrate 12 will aid in further assisting removal of any chips 16 caught on edge 24. It should be noted that the tapered edge 24 is only one possible arrangement. For example, the edge 24 could be wide enought to retain all the chips 16 which do not fall into the passageway 22.

The demounting device 18 shown in FIG. 2 is particularly intended for the segregation of those chips 16 on or near the periphery of the wafer 10 from the remaining chips. It is quite common for processing of wafers to lead to a greater number of imperfections along the peripheral area than in the portion nearer to the center. Thus, to segregate the peripheral chips 16, demounting device 18 can be designed to follow the same circumferential configuration as the wafer 10 but with a smaller diameter. The wafer 10 is then placed on the demounting device 18 in such a manner that the peripheral portion will lie outside of the passageway 22 along the complete circumference of wafer 10.

Support for the wafer 10 can be provided, of course, by means other than direct contact with the edge 24. For example, the wafer 10 could be held over the passageway 22 a short distance above the edge 24 by some other support such as suction cups or a mechanical handler.

Although the passageway 22 has been described as a completely surrounded opening, the invention is not so limited. Instead, an open-sided arrangement such as a parabola could be used in place of the closed wall 20. Also, the passageway 22 can be arranged to segregate any portion of the wafer 10 and is not limited to only sorting out the peripheral chips 16.

Demounting fluid 28 can be any fluid suitable to dissolve the particular soluble cement 14 used to mount the wafer 10 to the substrate 12. Trichlorethylene, which is a solvent for beeswax, and acetone which is a solevent for gylcolphthalate, are examples of demounting liquids. Demounting vapors can also be used. Although demounting fluid 28 is shown, it is also possible to use any type of demounting force which would cause the chips 16 to separate from the substrate 12. Some examples of this are heat, microwave energy, ultrasonic energy and high frequency vibration.

Frame Assembly

Figure 4:
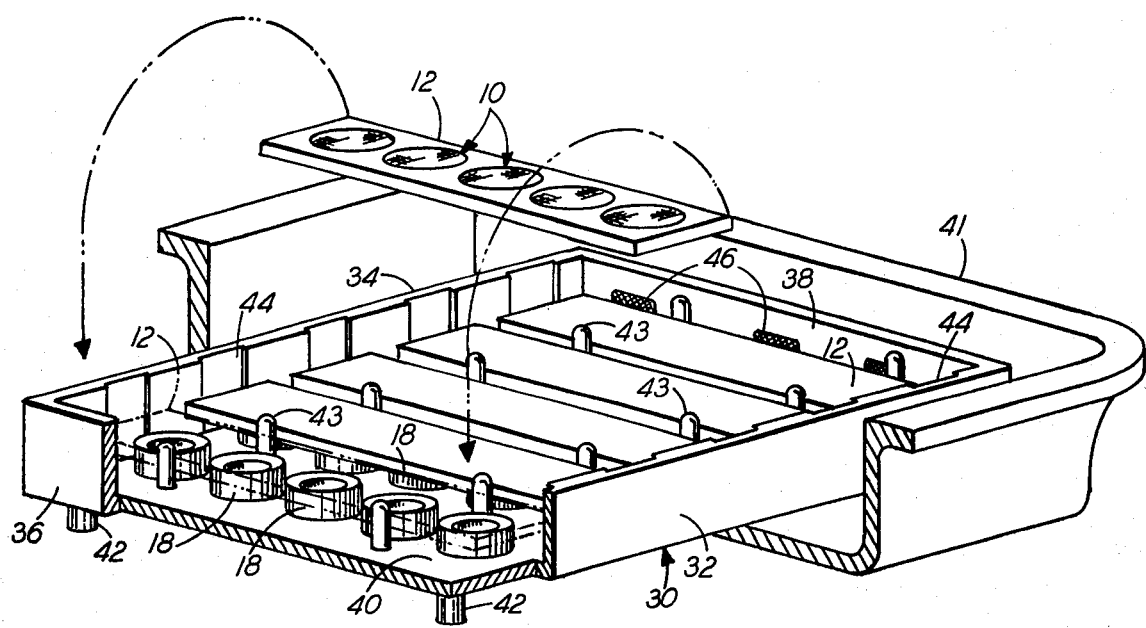
FIG. 4 is a perspective view of the apparatus of the present invention showing a plurality of the demounting devices of FIG. 2 mounted in a frame.

In order to provide a holder for a plurality of demounting devices 18, a frame, designated generally by the numeral 30, can be provided, such as shown in FIG. 4, comprising front wall 32, back wall 34, sidewalls 36 and 38, and bottom plate 40. If a demounting fluid is used, the entire frame 30 is placed in a pan 41 which serves as a container for the fluid. Feet 42 maintain frame 30 above the bottom of the pan 41 to allow fluid to flow under bottom plate 40. Demounting devices 18 are arranged in rows in the frame 30 with pins 43 located on both sides of each row to provide lateral side restraint for the substrate 12 when it is placed over the demounting devices 18. Note that the substrate 12 is shown in FIG. 4 as being common to a plurality of the wafers 10. Restraint of substrate movement from front-to-back of frame 30 is provided by front wall 32 and back wall 34 which are in close relationship to the edges of the substrate 12 when it is over the demounting devices 18. Notches 44 are provided along inner surfaces of the front and back walls 32 and 34 to allow added clearance for any chips 16 which will fall into the generally narrow space between the front and back walls and the demounting devices 18 which are nearest to those walls.

In operation, demounting fluid 28 can be introduced into the pan 41 to immerse the frame 30 to a depth sufficient to cover the demounting devices 18 and the cut wafers 10 mounted thereon as shown in FIG. 2. The chips 16 which are over the passageways 22 will then fall into the bottom of pan 41 or into catch bins 26 (FIG. 2), if such are provided. The remaining chips 16 will fall outside the demounting devices 18 onto the bottom plate 40. Screened drain ports 46 in sidewalls 36 and 38 of the frame 30 can then be used to drain the demounting fluid 28 without discarding the chips 16 from the frame. Similarly, catch bins 26 may have screened sections (see FIG. 2) to allow draining the demounting fluid from the bins without loosing any chips 16 which are in the bins. After the draining has occurred, all of the chips can be removed from their respective locations.

As an alternative to using the frame walls 32, 34, 36 and 38 to restrain lateral movement, it is possible to surround each individual demounting device 18 with three or more pins 43 while using one substrate 12 for each demounting device. Also, ridges or some other restraint could be used in place of the pins 43 to restrain lateral movement of the substrate 12.

Frame 30, the demounting devices 18 and the pan 41 can be constructed of any material such as stainless steel or aluminum which is resistant to the particular demounting fluid used. If it is desired to use demounting vapors, the pan 41 will generally be replaced by a screen holder which will support the frame 30 for insertion into the vapor demounting equipment (not shown).

Multiple Sorting Demounting Fixture

Figure 5:
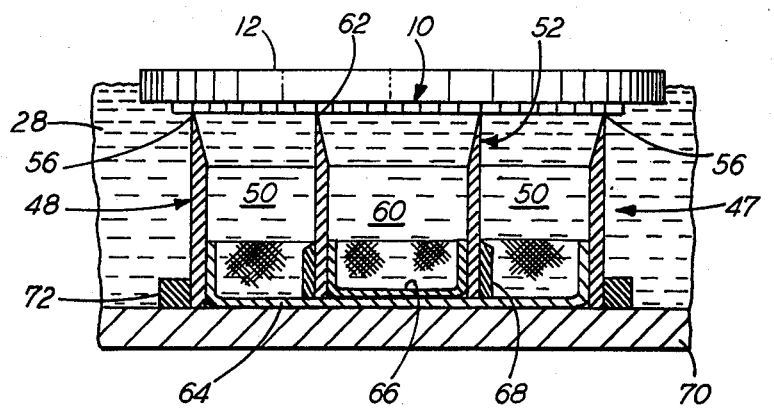
FIG. 5 shows a second embodiment of the present invention using a concentric demounting device.

FIG. 5 illustrates a second embodiment of the present invention wherein a multiple sorting demounting fixture, designated generally by the numeral 47, includes a primary demounting device, designated generally by the numeral 48, having a primary passageway 50. Located concentrically within the primary passageway 50 is a secondary demounting device, designated generally by the numeral 52. The primary demounting device 48 has a closed wall 54 which tapers internally to form primary edge 56 surrounding the primary passageway 50. The secondary demounting device 52 has a closed wall 58 surrounding a secondary passageway 60. Closed wall 58 also tapers at its upper end to form a secondary edge 62. Primary catch bin 64 is located at the bottom of primary passageway 50 and secondary catch bin 66 is located at the bottom of secondary passageway 60. A locating ring 68 is affixed to the primary catch bin 64 and encircles the lower portion of closed wall 58 to hold the secondary demounting device 52 in place. Any suitable means of affixing the locating ring 68 to the primary catch bin 64 such as bonding or welding may be used. A bottom plate 70 is provided to support the multiple sorting demounting fixture 47. Projections 72 from the bottom plate 70 restrict lateral motion of the closed wall 54 of the primary demounting device 48.

The purpose of secondary demounting device 52 is to provide further sorting of the chips 16 when the wafer 10 is placed upon the multiple sorting demounting fixture 47. In certain wafers, such as those used for LED's, it is desirable to sort a particular portion of the wafers in addition to or instead of sorting only the peripheral chips. Thus, when the wafer 10 is subjected to a demounting force such as demounting fluid 28, chips 16 which lie over the secondary passageway 60 will fall into the secondary catch bin 66 while chips which lie over the primary passageway 50 will fall into primary catch bin 64. Any peripheral chips 16 which lie outside of the primary passageway 50 will fall onto the bottom plate 72.

Secondary demounting device 52 can have the same circumferential configuration as the primary demounting device 48 or one which is different. It is also possible to simply provide a straight wall to subdivide the primary demounting device 48. Furthermore, although FIG. 5 illustrates the secondary demounting device 52 as being concentric with the primary demounting device 48, it could be placed anywhere within the device to isolate any particular portion desired.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. A method of sorting parts of an article which has been mounted onto a carrier and separated into a plurality of individual parts which are retained on the carrier comprising:

positioning the separated article and the carrier adjacent to a passageway so that the parts of a first portion of the separated article lie over the passageway while the parts of a second portion of the separated article lie outside of the passageway; and subjecting the separated article to a force for demounting the parts of the first portion of the separated article from the carrier to permit such parts to enter into the passageway.

2. A method as set forth in claim 1 wherein the demounting force is provided by a demounting fluid.

3. A method as set forth in claim 2 wherein the demounting fluid is a liquid.

4. A method as set forth in claim 2 wherein the demounting fluid is a vapor.

5. A method as set forth in claim 1 further comprising the step of:

applying a vibratory motion to the separated article and the carrier after the separated article has been subjected to the demounting force.

6. A method as set forth in claim 1, wherein the passageway is a first passageway, further comprising the step of:

directing a portion of the chips of the first portion of the separated article into an additional passageway which is located within the first passageway.

7. A method of sorting parts of an article comprising:
   mounting the article onto a carrier;
   separating the article into a plurality of individual parts with the individual parts remaining mounted on the carrier;

positioning the separated article and the carrier adjacent to a passageway so that the parts of a first portion of the separated article lie over the passageway while the parts of a second portion of the separated article lie outside of the passageway; and subjecting the separated article to a force for demounting the parts of the first portion of the separated article from the carrier to permit such parts to enter into the passageway.

8. A method as set forth in claim 7 wherein mounting the article is accomplished by a chemically soluble cement.

9. A method as set forth in claim 8 wherein the separating is accomplished by cutting completely through the article and the chemically soluble cement into the surface of the carrier.

10. A method as set forth in claim 7 further comprising the step of:

applying a vibratory motion to the separated article and the carrier after the separated article has been subjected to the demounting force.

11. An apparatus for sorting parts of an article which has been mounted onto a carrier and separated into a plurality of individual parts which are retained on the carrier comprising:

means for providing a passageway;

means for supporting the separated article and the carrier with the separated article being located adjacent to the means for providing a passageway so that the parts of a first portion of the separated article lie over the passageway while the parts of a second portion of the separated article lie outside the passageway; and means for subjecting the separated article to a force for demounting the parts on the first portion of the separated article from the carrier to enter into the passageway.

12. The apparatus of claim 11 wherein the supporting means is a continuous narrow edge surrounding the passageway and contacting the separated article so that the parts on the second portion of the separated article extend beyond the continuous narrow edge and will fall outside of the passageway when the separated article is subjected to the demounting force.

13. The apparatus of claim 12 further including means for applying a vibratory force to the separated article and carrier after the separated article has been subjected to the demounting force to urge parts which are retained on the continuous narrow edge to become dislodged therefrom.

14. The apparatus of claim 12 wherein the article has a peripheral edge which is of the same configuration as the continuous narrow edge.

15. The apparatus of claim 11, wherein the passageway is a first passageway, which further comprises means for providing at least one secondary passageway located within the first passageway to further sort the chips which fall into the first passageway.

16. The apparatus of claim 15 wherein the secondary passageway is concentric with the first passageway.

17. The apparatus of claim 11 which further comprises means for restraining lateral movement of the separated article and the carrier.

18. The apparatus of claim 17 wherein the means for restraining lateral movement comprises a plurality of pins located adjacent to the carrier.

19. The apparatus of claim 11 wherein the means for subjecting the separated article to the demounting force is a demounting fluid.

20. The apparatus of claim 11 further comprising a bin located in the passageway for catching the parts from the first portion of the separated article which fall into the passageway.

21. A method of sorting chips of a semiconductor wafer which has been mounted onto a substrate and separated into a plurality of individual chips which are retained on the substrate comprising:

positioning the separated wafer and the substrate adjacent to a passageway so that the chips of a first portion of the separated wafer lie over the passageway while the chips of a second portion of the separated wafer lie outside of the passageway; and subjecting the separated wafer to a force for demounting the chips of the first portion of the separated wafer from the substrate to permit such chips to enter into the passageway.

22. A method as set forth in claim 21 wherein the wafer is mounted onto the substrate by a soluble cement and the step of subjecting the wafer to a demounting force comprises exposing the wafer and substrate to a demounting fluid to dissolve the soluble cement.

23. An apparatus for sorting chips of a semiconductor wafer which has been mounted onto a substrate and separated into a plurality of individual chips which are retained on the substrate comprising:

means for providing a passageway;

means for supporting the separated wafer and the substrate with the separated wafer being located adjacent to the means for providing a passageway so that the chips of a first portion of the separated wafer lie over the passageway while the chips of a second portion of the separated wafer lie outside the passageway; and means for subjecting the separated wafer to a force for demounting the chips on the first portion of the separated wafer from the substrate to enter into the passageway.

24. The apparatus of claim 23 wherein the wafer is mounted onto the substrate by a soluble cement and the means for subjecting the separated wafer to a demounting force comprises a demounting fluid to dissolve the soluble cement.

* * * * *